United States Patent
Shi et al.

(10) Patent No.: US 11,081,408 B2
(45) Date of Patent: Aug. 3, 2021

(54) METHODS FOR WAFER WARPAGE CONTROL

(71) Applicant: YANGTZE MEMORY TECHNOLOGIES CO., LTD., Wuhan (CN)

(72) Inventors: Dandan Shi, Wuhan (CN); Ming Hu, Wuhan (CN); Shijin Luo, Wuhan (CN); Zhiliang Xia, Wuhan (CN); Zhi Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/737,149

(22) Filed: Jan. 8, 2020

(65) Prior Publication Data

US 2021/0111079 A1   Apr. 15, 2021

Related U.S. Application Data

(63) Continuation of application No. PCT/CN2019/110712, filed on Oct. 12, 2019.

(51) Int. Cl.
| | |
|---|---|
| *H01L 21/66* | (2006.01) |
| *H01L 21/02* | (2006.01) |
| *H01L 29/66* | (2006.01) |
| *H01L 29/10* | (2006.01) |
| *H01L 27/11582* | (2017.01) |
| *H01L 27/11556* | (2017.01) |

(52) U.S. Cl.
CPC ........ *H01L 22/20* (2013.01); *H01L 21/02532* (2013.01); *H01L 21/02595* (2013.01); *H01L 29/1037* (2013.01); *H01L 29/66545* (2013.01); *H01L 27/11556* (2013.01); *H01L 27/11582* (2013.01)

(58) Field of Classification Search
CPC .............. H01L 22/20; H01L 21/02532; H01L 21/02595; H01L 29/1037; H01L 29/66545; H01L 27/11556; H01L 27/11582

See application file for complete search history.

(56) References Cited

U.S. PATENT DOCUMENTS

2017/0011941 A1* 1/2017 Kato ................. H01L 21/67103
2017/0243738 A1* 8/2017 Noda ..................... B05D 1/005
(Continued)

FOREIGN PATENT DOCUMENTS

| CN | 103035502 A | 4/2013 |
| CN | 107170696 A | 9/2017 |

OTHER PUBLICATIONS

Chinese Office Action dated Dec. 4, 2020 in corresponding Chinese Patent Application No. 201980002411.5, 9 pages.

*Primary Examiner* — Seahvosh Nikmanesh
(74) *Attorney, Agent, or Firm* — Oblon, McClelland, Maier & Neustadt, L.L.P.

(57) ABSTRACT

Aspects of the disclosure provide a method for wafer warpage control. The method includes forming a filling structure in a slit opening on a wafer. Further, the method includes measuring a warpage parameter of the wafer, and determining a thermal profile to adjust a warpage parameter into a target range based on the warpage parameter. Then, the method includes performing a process having the determined thermal profile to adjust the warpage parameter into the target range.

20 Claims, 7 Drawing Sheets

(56) References Cited

U.S. PATENT DOCUMENTS

| | | | | |
|---|---|---|---|---|
| 2018/0340832 A1* | 11/2018 | Hawrylchak | ......... | G01J 5/0007 |
| 2020/0070287 A1* | 3/2020 | Mutuku | ............... | B23K 35/264 |
| 2020/0360722 A1* | 11/2020 | Xia | ...................... | A61N 5/0622 |
| 2021/0083143 A1* | 3/2021 | Pinnington | ........... | H01L 33/007 |

* cited by examiner

METHODS FOR WAFER WARPAGE CONTROL

RELATED APPLICATION

This application is a bypass continuation of International Application No. PCT/CN2019/110712, filed on Oct. 12, 2019. The entire disclosure of the prior application is hereby incorporated by reference in its entirety.

BACKGROUND

Semiconductor manufactures increase wafer size to reduce production costs. The larger wafer size poses numerous technical challenges. For example, a larger wafer tends to have larger warpage. The larger warpage can cause difficulties to maintain a uniform processing environment across the wafer.

SUMMARY

Aspects of the disclosure provide a method for wafer warpage control. The method includes forming a filling structure in a slit opening on a wafer with a material that is characterized of a thermal-warpage adjustment relationship. Further, the method includes measuring warpage parameters of the wafer and determining a thermal profile to adjust the warpage parameters into a target range based on the thermal-warpage adjustment relationship. Then, the method includes performing a process having the determined thermal profile to adjust the warpage parameters into the target range.

To form the filling structure in the slit opening on the wafer with the material that is characterized of the thermal-warpage adjustment relationship, in an example, the method includes forming the filling structure in the slit opening on the wafer with polysilicon that is characterized of the thermal warpage adjustment relationship. For example, the method includes filling the slit opening on the wafer with a polysilicon layer, removing an upper portion of the polysilicon layer to form a recess in the slit opening, and filling a conductive layer into the recess in the slit opening.

In some embodiments, the method includes stacking sacrificial gate layers and insulating layers alternatingly along a direction perpendicular to a substrate of the semiconductor device to form a stack of alternating sacrificial gate layers and insulating layer upon the substrate. Then, the method includes forming channel structures in the stack of alternating sacrificial gate layers and insulating layers and forming the slit opening in the stack of alternating sacrificial gate layers and insulating layers.

Then, in some embodiments, the method includes replacing, via the slit opening, the sacrificial gate layers with gate layers. Further, the method includes forming an isolation layer on the sidewall of the slit opening before forming the filling structure in the slit opening and forming a doped region at a bottom of the slit opening. The doped region is conductively connected to at least a source terminal of a channel structure.

To determine the thermal profile to adjust the warpage parameters into the target range based on the thermal-warpage adjustment relationship, in an example, the method includes selecting the thermal profile from a plurality of thermal profiles that are pre-characterized of warpage adjustments. In another example, the method includes determining at least one of a temperature for ramping up/down, a ramp up/down speed of the temperature, a holding time of the temperature, and a number of cycles for ramping up/down of the temperature. In some embodiments, the method also includes determining a stage in fabrication processes of the wafer to insert the process having the determined thermal profile.

According to some aspects of the disclosure, the material is characterized of a thermal-stress relationship. Then, based on the thermal-stress relationship and an area coverage of the material, the thermal-warpage adjustment can be determined based on the thermal-stress relationship.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
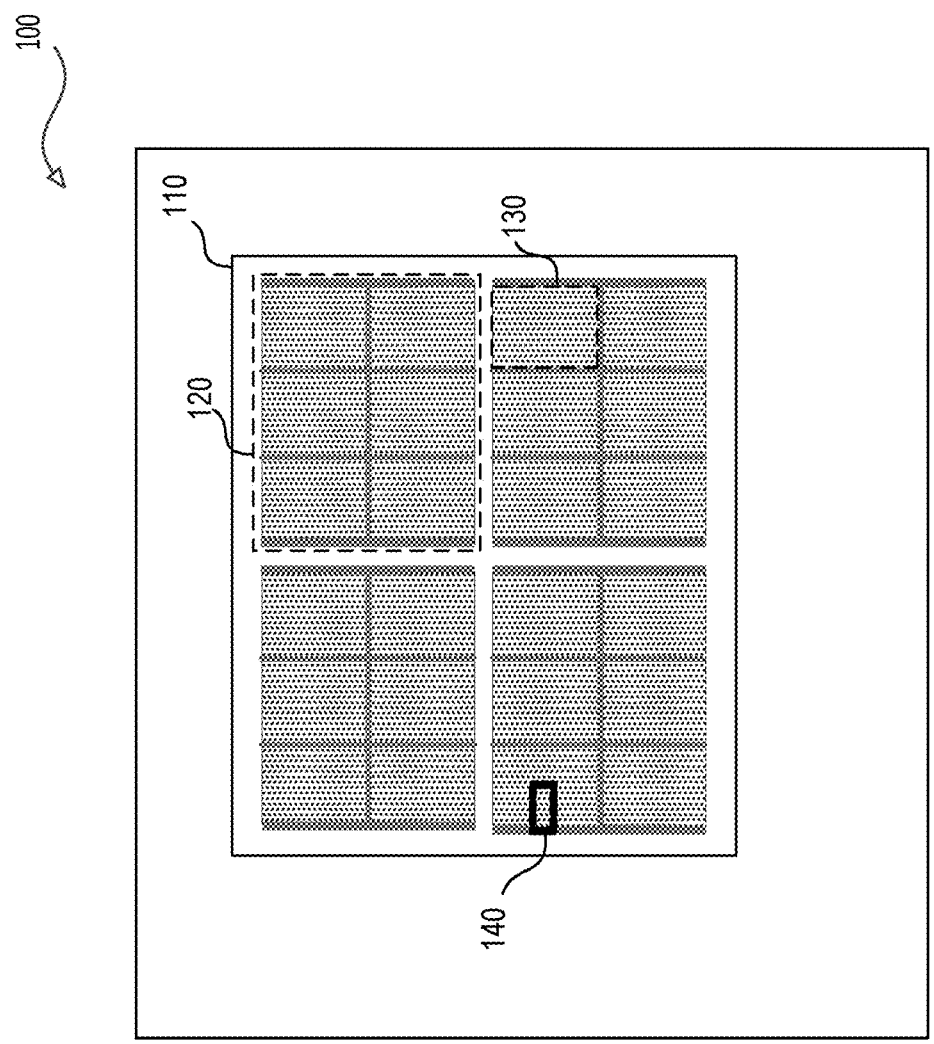
FIG. 1 shows a top-down view of a semiconductor device according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Three-dimensional (3D) semiconductor memory devices can be formed on a substrate that includes an array region (also referred to as core region in some examples) for forming an array of memory cells and a connection region for forming connections to the memory cells. For example, the memory cells are formed in the array region as an array of vertical memory cell strings. The vertical memory cell strings are formed of gate layers and insulating layers that are stacked alternatingly. At the connection region, the stack of gate layers and the insulating layers are patterned into stair steps to provide contact pads for connecting the gate layers to control lines, such as select lines, word lines and the like.

During the process of forming the stack of gate layers and the insulating layers on a wafer, wafer warpage happens due to stress. The wafer warpage can result in various serious processing issues, such as weak vacuum suction, lithography defocusing, cracks, packaging difficulty, and the like. The disclosure provides techniques to control the wafer warpage in an acceptable range to avoid the processing issues due to severe wafer warpage.

In some embodiments, a material that is used for forming a structure in the 3D semiconductor memory device is pre-characterized to build a thermal-stress relationship. For example, the material will apply different stress to the wafer under different thermal profiles. The relationship of the stress to the thermal profiles is suitably characterized, built and stored. In some examples, based on area coverage of the material on a wafer, the warpage adjustments associated with the thermal profiles can be determined.

In other embodiments, the material is pre-characterized based on the design of the 3D semiconductor device to build a thermal-warpage adjustment relationship.

Further, in some embodiments, at a stage during the fabrication processes of a wafer, wafer warpage is measured. When the wafer warpage is out of an acceptable range, a thermal profile is determined based on the thermal-stress relationship. For example, the thermal profile is selected from a plurality of thermal profiles, and the selected thermal profile can apply stress associated with the thermal profile to counteract the wafer warpage in a direction to adjust the wafer warpage into the acceptable range. Then, a thermal process is conducted on the wafer following the selected thermal profile. In an example, the stage is before a process that is sensitive to the wafer warpage. In another example, the stage is before the back end of line (BEOL) processes (e.g., metal process) that generally use relatively low temperatures that have little influence on wafer warpage.

In some examples, polysilicon is used with tungsten in an array common source structure to reduce tensile stress introduced by tungsten. Generally, a fixed thermal profile is used at the time of forming the array common source structure in some related examples. According to an aspect of the disclosure, thermal processes can be used at later stages during wafer fabrication to use the polysilicon to control wafer warpage. The thermal profiles of the thermal processes can be determined based on wafer warpage measurements. In some embodiments, various thermal profiles can be characterized to determine, for each thermal profile, the direction and the amount of stress that can be generated by the polysilicon for wafer warpage adjustment. In some embodiments, different designs may have different area coverage of array common source structures, and different area coverage of array common source structures may apply different amounts of the strength for warpage adjustment under the same thermal profile. Thus, in some embodiments, when the thermal-stress relationship is characterized, based on area coverage of array common source structures in a design, the thermal-warpage adjustment relationship can be determined.

It is noted that while the following description uses array common source structure and polysilicon in the 3D semiconductor memory device fabrication as examples, the disclosed techniques can be applied to other structures and materials for wafer fabrication. In some examples, dummy structures (e.g., dummy array common source structures) can be disposed (for example, in a direction different from regular array common source structures) in scribe lines between dies on a wafer, and the dummy structures can be used to apply stress and adjust wafer warpage in an example.

FIG. 1 shows a top-down view of a semiconductor device 100 according to some embodiments of the disclosure. The semiconductor device 100 includes a memory portion 110 that are formed of three-dimensional (3D) memory cells. The memory portion 110 can include one or more memory planes 120, and each of memory planes 120 can include a plurality of memory blocks 130. In some examples, concurrent operations can take place at the memory planes 120. In some embodiments, each of the memory blocks 130 is the smallest unit to carry out erase operations. In the FIG. 1 example, the memory portion 110 includes four memory planes 120 and each of the memory planes 120 includes six memory blocks 130. Each of the memory blocks 130 can include a plurality of memory cells, and each memory cell can be addressed through interconnections, such as bit lines and word lines. In some examples, the bit lines and word lines can be laid out perpendicularly, forming an array of metal lines. For example, the word lines extend in the X direction, and the bit lines extend in the Y direction.

Further, each memory block 130 can be divided into block portions 140 according to stair division patterns. The block portions 140 have identical or equivalent stair division patterns. The details of the block portions 140 will be described with reference to examples in FIGS. 2-4.

It is noted that the semiconductor device 100 can be any suitable device, for example, memory circuits, a semiconductor chip (or die) with memory circuits formed on the semiconductor chip, a semiconductor wafer with multiple semiconductor dies formed on the semiconductor wafer, a stack of semiconductor chips, a semiconductor package that includes one or more semiconductor chips assembled on a package substrate, and the like.

It is also noted that, the semiconductor device 100 can include other suitable circuitry (not shown), such as logic circuitry, power circuitry, and the like that is formed on the same substrate, or other suitable substrate, and is suitably coupled with the memory portion 110. Generally, the memory portion 110 includes the memory cells and peripheral circuitry (e.g., address decoder, driving circuits, sense amplifier and the like).

Figure 2:
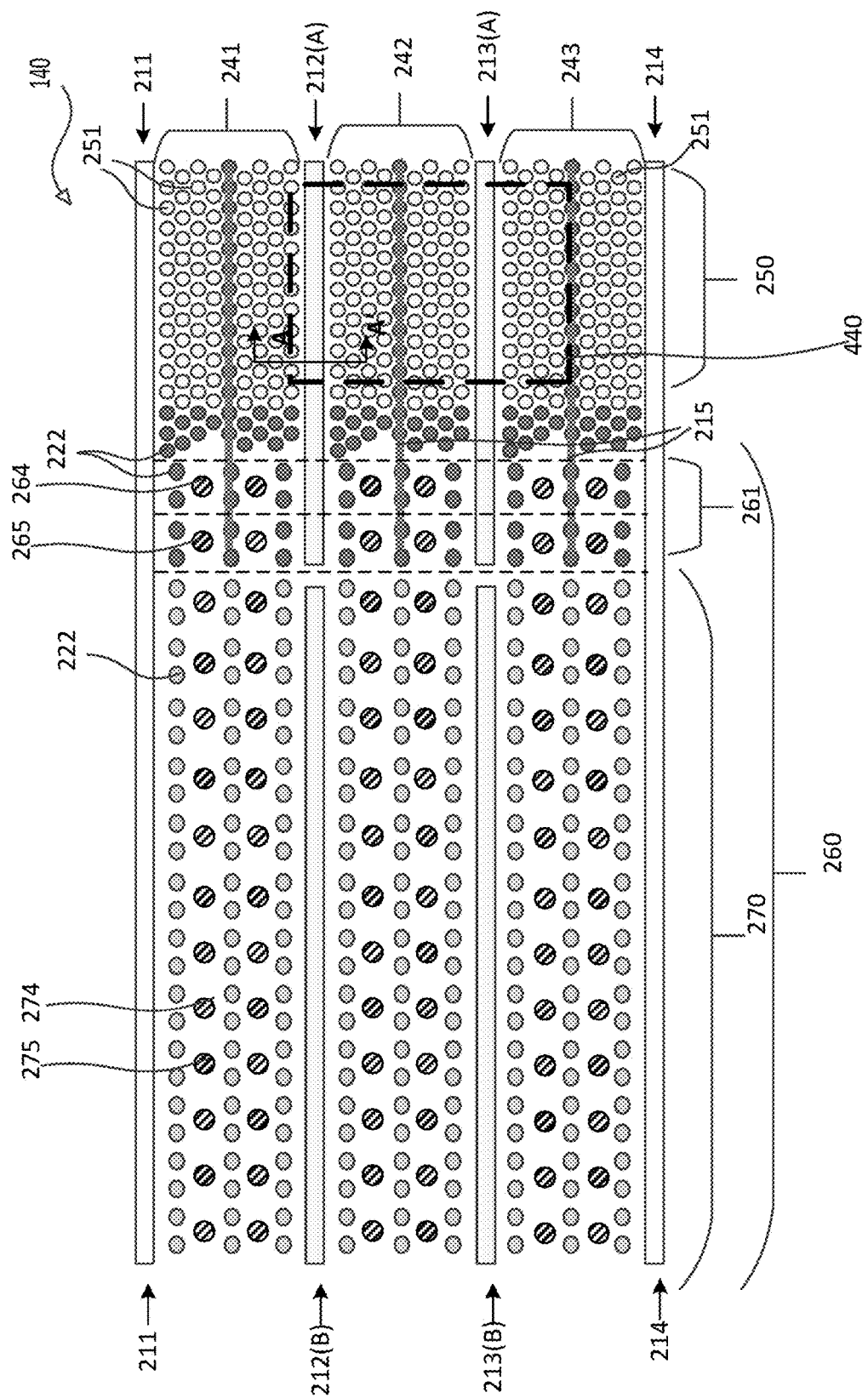
FIG. 2 shows a top-down view of a block portion in the semiconductor device according to some embodiments of the disclosure.
Figure 3A:
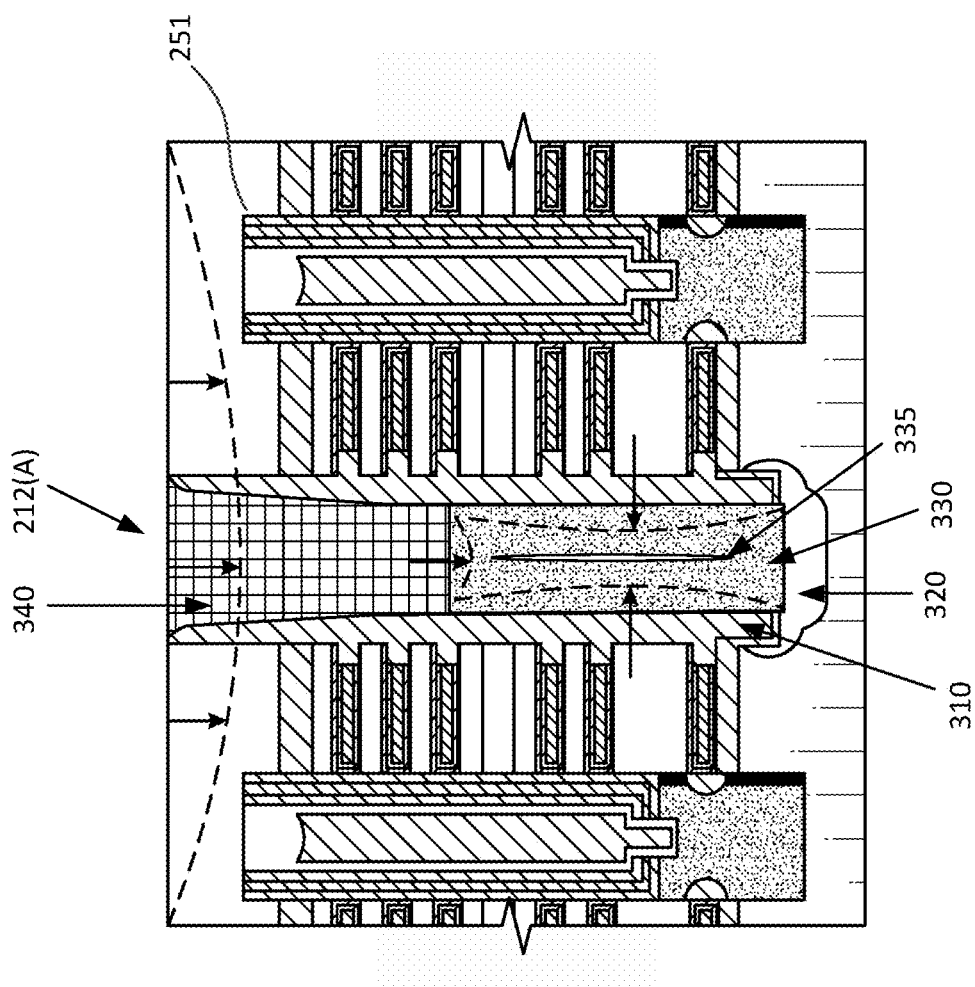
FIG. 3A shows a cross-sectional view of the block portion according to some embodiments of the disclosure.
Figure 3B:
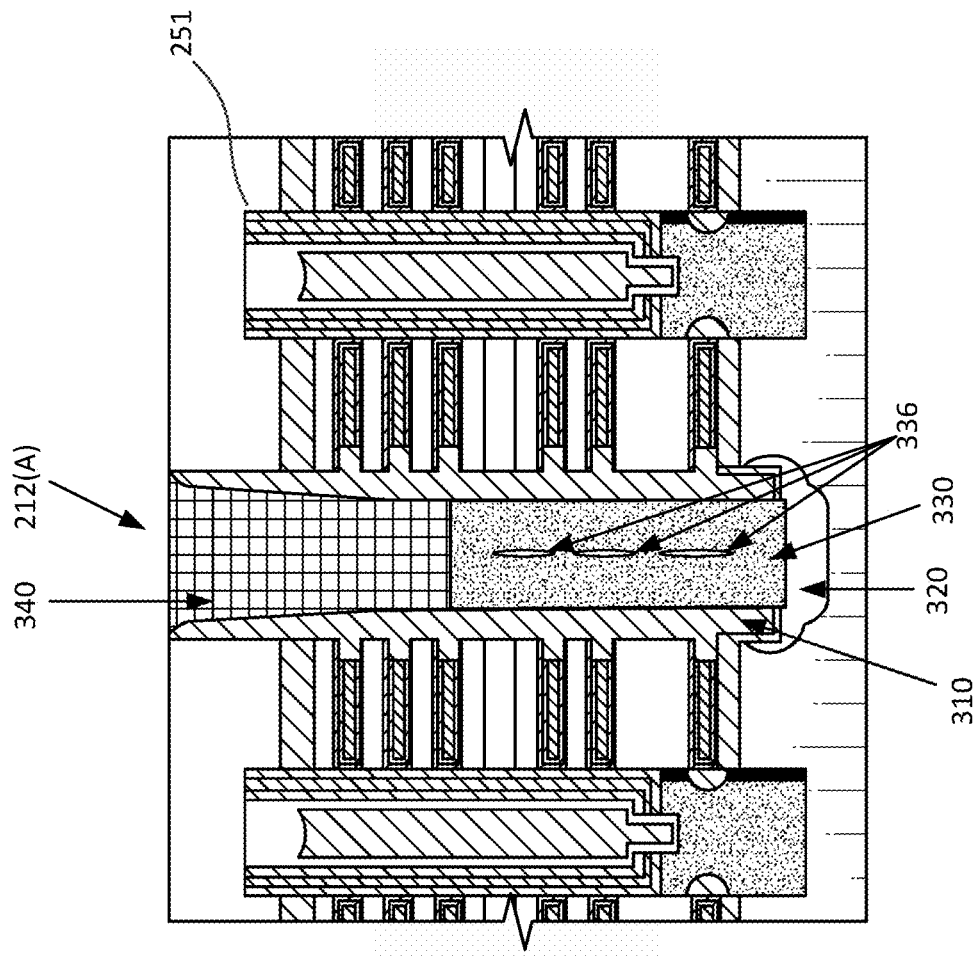
FIG. 3B shows a cross-sectional view of the block portion during a thermal processing according to some embodiments of the disclosure.
Figure 4:
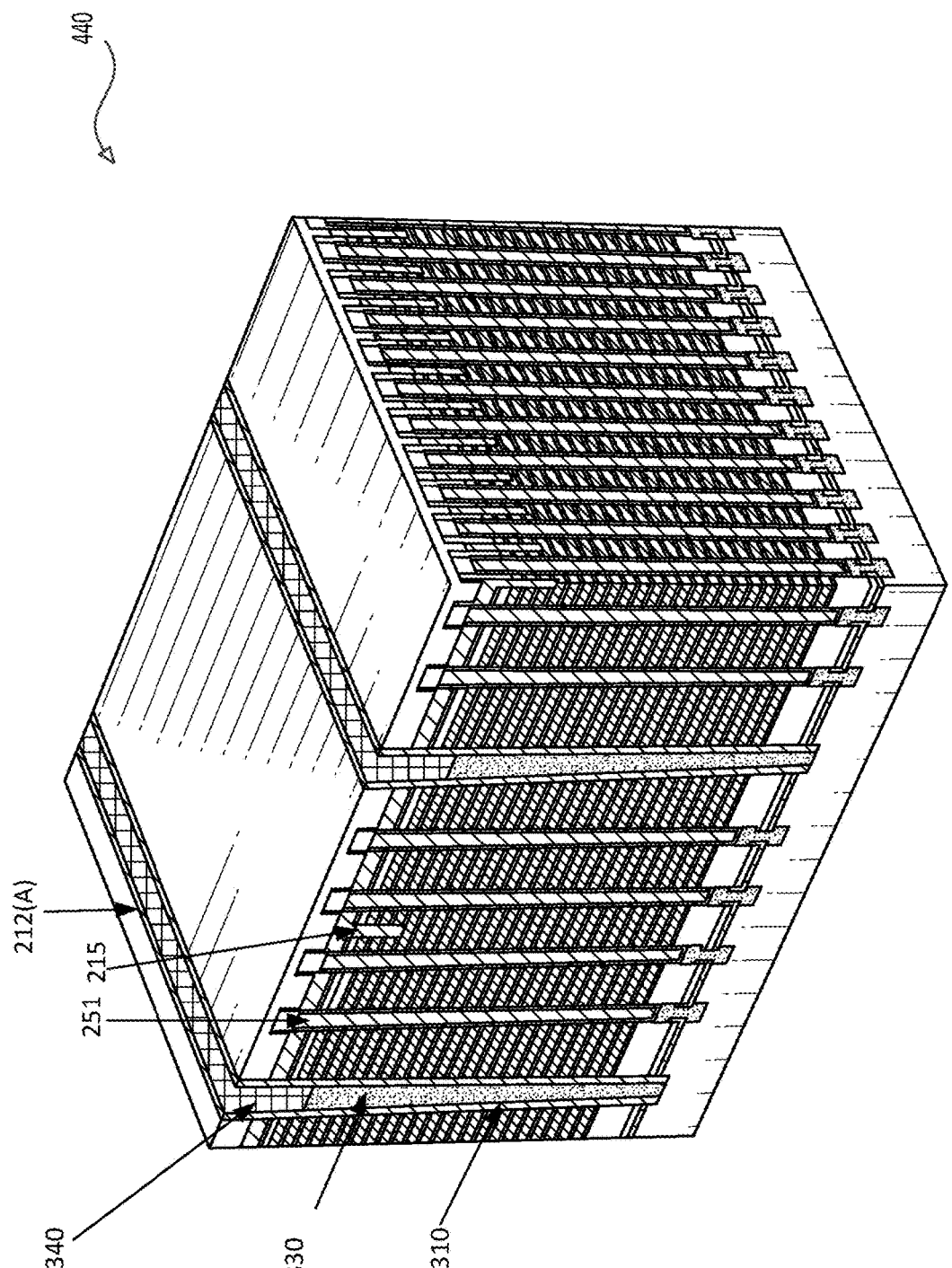
FIG. 4 shows an example of a perspective view of the block portion of the semiconductor device during fabrication according to some embodiments of the disclosure.

FIG. 2 shows a top-down view example of the block portion 140, FIGS. 3A and 3B show cross-sectional view examples of the block portion 140 at line A-A', and FIG. 4 shows a perspective view example of a part 440 of the block portion 140 according to some embodiments of the disclosure. In some examples, the block portion 140 includes an array region 250 and a connection region 260. The array region 250 includes an array of memory strings 251, and each memory string 251 includes a plurality of stacked memory cells connected in series with one or more top select transistors and one or more bottom select transistors. The connection region 260 includes a top select gate (TSG) connection region 261, and a memory cell gate (MCG) connection region 270. The TSG connection region 261 includes a staircase structure and contact structures (e.g., contact structures 264 and 265) for connecting metal wires to the gates of the top select transistors to control the top select transistors. The MCG connection region 270 includes staircase structures and contact structures (e.g., contact structures 274 and 275) for connecting word lines to the gates of the memory cells.

It is noted that, the connection region 260 may also include a bottom select gate (BSG) connection region (not shown) that includes a staircase structure and contact structures for connecting metal wires to the gates of the bottom select transistors to control the bottom select transistors.

In some embodiments, a gate-last fabrication technology is used, thus slit openings are formed to assist the removal of sacrificial gate layers, and the formation of the real gates. After the formation of the real gates, the slit openings are filled to form slit structures. In the FIGS. 2-4 example, slit structures 211, 212(A), 212(B), 213(A), 213(B) and 214 are formed. The slit structures 211, 212(A), 212(B), 213(A), 213(B) and 214 extend in the X direction, and parallel to each other. The slit structures 211 and 214 separate the block portion 140 from neighboring portions. The slit structures 212(A) and 213(A) are disposed in the array region 250 and can divide the array of memory cell strings in the block portion 140 into three fingers 241, 242 and 243. The slit structures 212(B) and 213(B) are disposed in the connection region 260 and can divide the connection region 260 into multiple portions.

In an example, the slit structures 211 and 214 are continuous slit structures that are filled with insulating layers to electrically insulate the gate layers of the block portion 140 from neighboring portions.

In some examples, the number of the slit structures in the connection region 260 is the same as the number of slit structures in the array region 250. In the FIG. 2 and FIG. 3A example, the slit structures 212(B) and 213(B) are aligned with the slit structures 212(A) and 213(A). However, the slit structures 212(B) and 213(B) are broken from the slit structures 212(A) and 213(A) and are not continuous parts of the slit structures 212(A) and 213(A), thus the gate layers in the three fingers 241-243 are connected.

It is noted, in another example, the slit structures 212(B) and 213(B) are not aligned with the slit structures 212(A) and 213(A). In another example, the number of slit structures in the connection region 260 is not the same as the number of slit structures in the array region 250.

In some embodiments, at least some slit structures can function as the array common source for an array of memory strings 251 in the array regions 250.

In the FIGS. 2-4 example, top select gate cuts 215 can be disposed in the middle of each finger to divide a top select gate (TSG) layer of the memory finger into two parts, and thereby can divide a memory finger into two separately programmable (read/write) pages. While erase operation of a 3D NAND memory can be carried out at memory block level, read and write operations can be carried out at memory page level. In some embodiments, dummy channel structures 222 can be disposed at suitable places for process variation control during fabrication and/or for additional mechanical support.

It is noted that, in some examples, the top select gate cuts 215 do not cut the memory cell gate layers and the bottom select gate layers.

The TSG connection region 261 and the MCG connection region 270 include suitable staircase structures to form contact pads and then contact structures can be formed on the contact pads to connect, for example, page control lines and word lines with the gate layers.

According to some aspects of the disclosure, some slit structures, such as the slit structures 212(A) and 213(A) can be used as array common source (ACS) contacts. Specifically, as shown in FIG. 3A, an isolation layer 310 is formed on the sidewalls of the slit opening for the slit structure 212(A) to isolate the gate layers to the ACS, and a doped region 320 is formed in the substrate at the bottom of the slit opening of the slit structure 212(A). It is noted that the isolation layer 310 can include one or more layers of same or different materials. Further, filling materials are filled in the slit opening to form the slit structure 212(A). In some embodiments, when the filling materials are used to form ACS contacts, conductive materials, such as doped polysilicon, tungsten and the like can be used. In some embodiments, the doped region 320 is formed in the substrate and in connection with the sources of the memory strings 251. The conductive materials can connect the doped region 320 with metal wires that provide control signals for the array common source.

In the FIG. 3A example, the conductive materials include a first portion 330 of doped polysilicon and a second portion 340 of tungsten. In an example, the tungsten can introduce tensile stress, and the polysilicon can shrink and then reduce the tensile stress. According to some aspects of the disclosure, the first portion 330 may deform due to various reasons, such as intrinsic strain stress of the doped polysilicon material, changes of voids in the doped polysilicon. In some examples, during the deposition of the polysilicon layer for the first portion 330, voids 335 may be formed in the polysilicon layer, for example due to the high aspect ratio of the slit openings. The shapes of the voids 335 may change during following processes and cause deformation of the first portion 330 and deformation of the whole wafer in an example, such as shown by the dashed lines in FIG. 3A.

Generally, after the formation of array common source (ACS), a thermal processing is applied on the wafer to tune the material property of the polysilicon to be suitable for absorbing the tensile stress at the time of tungsten deposition.

According to some aspects of the disclosure, further thermal processing can be applied to the wafer in one or more later stages of wafer fabrication to use the material property of the polysilicon to control wafer warpage. It is noted that the techniques of using thermal processing to control material property of the polysilicon and thus to control wafer warpage can be used to control the wafer warpage due to various factors, such as the intrinsic strain stress of the first portion 330, the shape change of the voids 335, and other factors that may cause wafer warpage.

According to an aspect of the disclosure, a thermal processing can be suitably designed to reduce or remove intrinsic stain stress of the polysilicon in order to control wafer warpage. According to another aspect of the disclosure, a thermal processing can be suitably designed to reduce or remove voids in the polysilicon in order to control wafer warpage.

In some embodiments, the slit structures 211, 212(A), 212(B), 213(A), 213(B) and 214 can be formed of the same structure and components. It is noted that the slit structures are disposed across the memory product region, and have a relatively large area coverage, and can apply a relatively large warpage adjustments on wafer. It is also noted, in an example, the slit structures 211, 212(A), 212(B), 213(A), 213(B) and 214 extend in a direction, such as X direction. In an example, voids in the polysilicon extend in X direction, and thus the polysilicon in the slit structures 211, 212(A), 212(B), 213(A), 213(B) and 214 have a relatively large warpage adjustments over the Y direction for example. In some examples, dummy slit structures extending in Y direction can be placed in the scribe lines to provide warpage adjustments over the X direction for example.

In some embodiments, the slit structures 212(B) and 213(B) can be formed differently from the slit structures 212(A) and 213(A). In some embodiments, a wafer can include dummy slit structures in scribe lines for example, and the dummy slit structures can have the same direction as or different direction from the slit structures 211, 212(A), 212(B), 213(A), 213(B) and 214, and can be formed of the same structure and components as the slit structures 212(A) and 213(A). For example, the slit structures 211, 212(A), 212(B), 213(A), 213(B) and 214 extend in X-direction, and the dummy slit structures can extend in Y-direction.

According to an aspect of the disclosure, material property of the polysilicon that forms the slit structures 212(A) and 213(A) can vary with different thermal profiles. In an example, a spike thermal process that quickly raises a temperature to about 1,000° C., and then quickly reduces the temperature can harden the polysilicon (thus the polysilicon does not shrink much) and stable the material property of the polysilicon, thus the material property of the polysilicon won't change much. In another example, a gradual thermal process that gradually raises a temperature to, for example 800° C., and then gradually reduces the temperature can reduce voids in the polysilicon, and thus cause the poly silicon to shrink more.

In some embodiments, a plurality of thermal profiles can be characterized to determine the material property of the polysilicon under the different thermal profiles.

According to an aspect of the disclosure, different approaches of thermal processing can be used on a severity of the wafer warpage. In an example, when the wafer warpage is not severe, such as in an acceptable range, a thermal process that rapidly (e.g., rising time is shorter than a rising time limit) raises temperature to, for example, in a range from 800° C. to 1,000° C., and keeps the temperature for a pre-defined short time period (e.g., the pre-defined short time period is shorter than a time limit) can cause the polysilicon to rapidly grow grains to fill the voids or reduce the voids. It is noted that the range of temperature is not limited to the range from 800° C. to 1,000° C. in other examples. In an example of this type of thermal process, when the voids are reduced or disappeared, the stress due to voids can be reduced to improve warpage.

In another example, when the wafer warpage is relatively large, such as out of an acceptable range, a thermal process that includes two temperature raising steps can be used to reduce the number or sizes of voids or remove the voids and apply the wafer warpage adjustment. The first step raises the temperature into a relatively low temperature range, such as a range from 600° C. to 800° C., and keeps the temperature for a pre-determined time duration. During the time duration of the first step, new bonds can be formed to connect opposite sides of the voids and the new bonds break a large void into smaller ones, such as smaller voids 336 shown in FIG. 3B. The second step raises the temperature into a relatively high temperature range, such as a range from 800° C. to 1,000° C. and keeps the temperature for a pre-defined time period to fill the voids and solidify the polysilicon. In an example of this type of thermal process, when the voids are reduced or disappeared, the stress due to voids can be reduced to improve warpage. It is noted that the low temperature range and the low temperature range are not limited to the above examples. In some embodiments, the sequence of the two temperature raising steps can be changed, thus the high temperature step is executed before the low temperature step.

Figure 5:
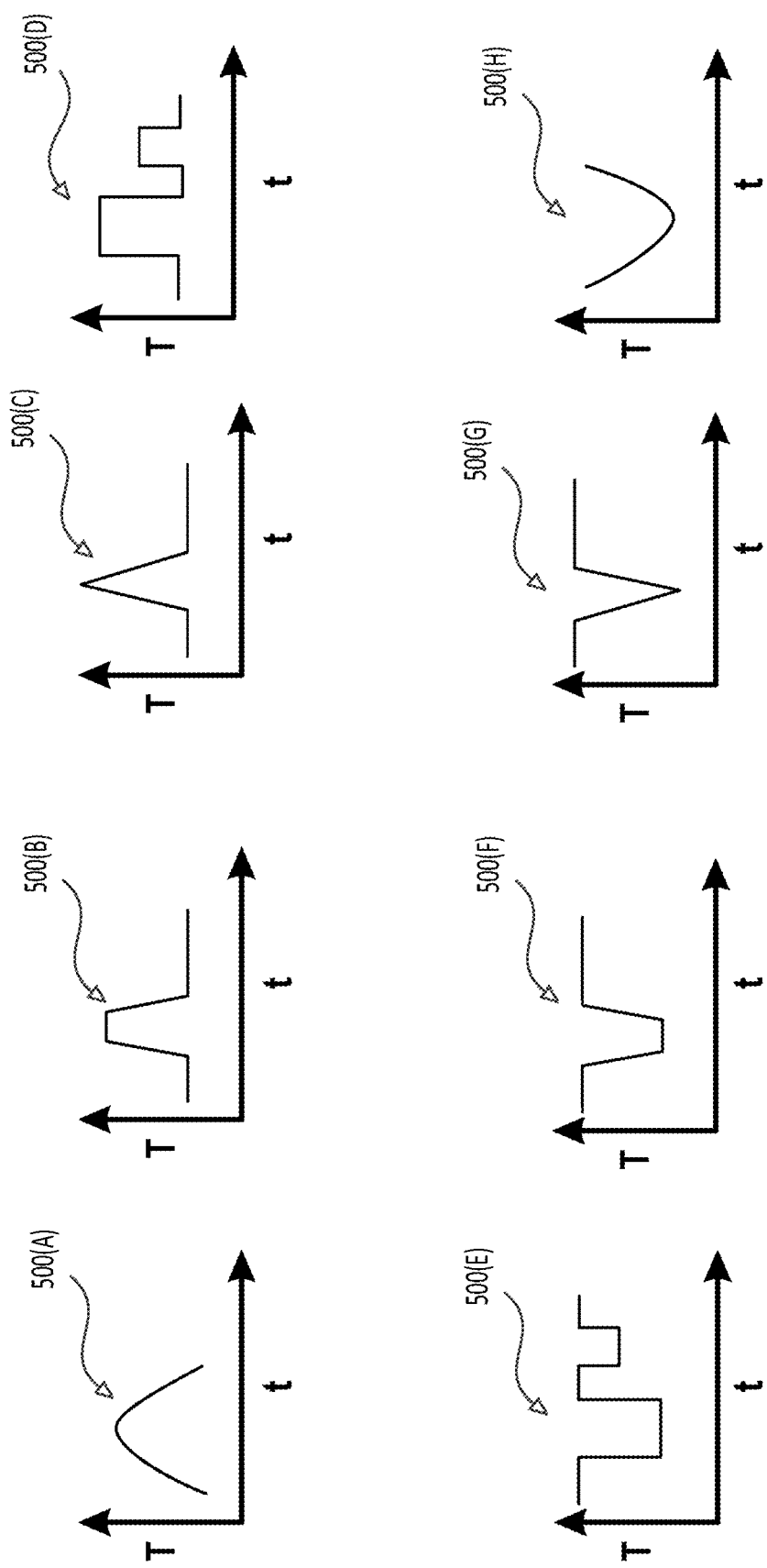
FIG. 5 shows thermal profile examples according to some embodiments of the disclosure.

FIG. 5 shows thermal profile examples 500(A) to 500(H) according to some embodiments of the disclosure. Each thermal profile shows a profile of temperature (T) changing with time (t). The thermal profiles can have different thermal parameters. For example, the thermal profile 500(A) gradually raises the temperature and then gradually reduces the temperature. The thermal profile 500(B) raises the temperature to a high temperature, keeps the high temperature for a time duration, and then reduces the temperature. The thermal profile 500(C) raises the temperature to a high temperature and then reduces the temperature without holding the high temperature. The thermal profile 500(D) cyclically raises and reduces a temperature.

It is noted that, the thermal profiles 500(A)-500(H) are merely examples, other suitable thermal profiles can be used. It is also noted that various parameters can be changed for the thermal profiles, such as the value of the high temperature, the holding time duration of the high temperature, the slope for ramping up/down the temperature, the number of temperature ramping up/down cycles, and the like.

According to an aspect of the disclosure, a suitable thermal process can be determined based on wafer warpage measurements. In some embodiments, back end of line (BEOL) processes that are used to form metal layers generally use relatively low temperature, and thus the BEOL processes cause little changes to wafer warpage. In some examples, before the BEOL processes, a thermal process is performed to adjust the wafer warpage into an acceptable range, thus the wafer warpage of the final wafer can be in the acceptable range. In another example, before a process that is sensitive to wafer warpage, a thermal process is performed to adjust the wafer warpage into the acceptable range.

Figure 6:
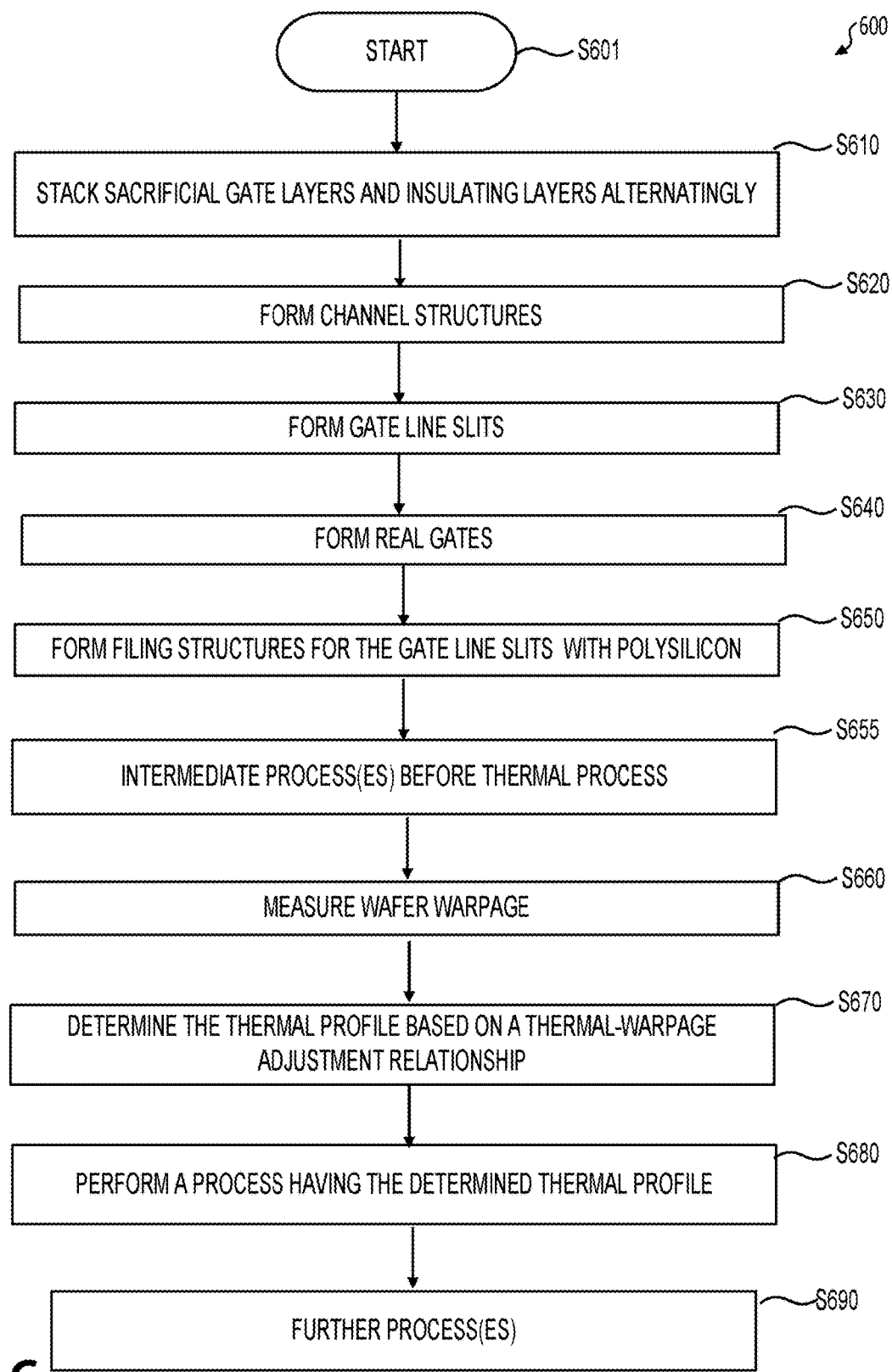
FIG. 6 shows a flow chart outlining a process example for fabricating a semiconductor device according to some embodiments of the disclosure.

FIG. 6 shows a flow chart outlining a process example 600 according to some embodiments of the disclosure. The process 600 is executed to fabricate 3D semiconductor devices on one or more wafers, and control wafer warpage in an acceptable range. In some examples, the wafer warpage control is performed based on thermal process on polysilicon material that is used to form array common source connections in gate line slits. In an example, the polysilicon material is characterized to determine thermal-stress relationship. Then, based on area coverage of the polysilicon material, thermal-warpage adjustment relationship can be determined. In another example, the specific 3D semiconductor device is used in characterization to determine a thermal-warpage adjustment relationship of the polysilicon material. Then, the process starts at S601 and proceeds to S610.

At S610, sacrificial gate layers and insulating layers are stacked alternatingly on a substrate to form an initial stack. The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer. In some examples, the insulating layers are made of insulating material(s), such as silicon dioxide, and the like, and the sacrificial layers are made of silicon nitride. In some embodiments, staircases are then formed in the connection region.

At S620, channel structures are formed. In an example, suitably planarization process is performed to obtain a relatively flat surface. Then, photo lithography technology is used to define patterns of channel holes and dummy channel holes in photoresist and/or hard mask layers, and etch technology is used to transfer the patterns into the stack of sacrificial layers and insulating layers. Thus, channel holes are formed in the array region 250 and the dummy channel holes are formed in the connection region in an example.

Then, channel structures are formed in the channel holes, and dummy channel structures are formed in the dummy channel holes. In some embodiments, dummy channel structures can be formed with the channel structures, thus the dummy channel structures are formed of the same materials as the channel structures. In some embodiments, the dummy channel structures are formed differently from the channel structures.

At S630, gate line slits (also referred to as slit openings in some examples) are formed. In some embodiments, the gate line slits are etched as trenches in the stack. In some examples, the gate line slits in the connection region have the same pitch as the gate line slits in the array region.

At S640, real gates are formed. In some embodiments, using the gate line slits, the sacrificial layers can be replaced by the gate layers. In an example, etchants to the sacrificial layers are applied via the gate line slits to remove the sacrificially layers. In an example, the sacrificial layers are made of silicon nitride, and the hot sulfuric acid ($H_2SO_4$) is applied via the gate line slits to remove the sacrificial layers. Further, via the gate line slits, gate stacks to the transistors in the array region are formed. In an example, a gate stack is formed of a high-k dielectric layer, a glue layer and a metal layer. The high-k dielectric layer can include any suitable material that provide the relatively large dielectric constant, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), and the like. The glue layer can include refractory metals, such as titanium (Ti), tantalum (Ta) and their nitrides, such as TiN, TaN, W2N, TiSiN, TaSiN, and the like. The metal layer includes a metal having high conductivity, such as tungsten (W), copper (Cu) and the like.

At S650, filing structures with polysilicon are filled in the gate line slits. In some embodiments, isolation layers are formed. For example, after forming the gate layers, portions of the gate layers that are close to the gate line slits can be removed to form recesses on the sidewalls. Then, isolations are formed on the sidewalls of the gate line slits. For example, the isolation layers are deposited to cover the recesses on the sidewalls, the sidewall and the bottom of the gate line slits.

In some embodiments, after the deposition of the isolation layers, an etching process can be performed to remove portions of the isolation layers at the bottom of the gate line slits to expose the substrate. Then, the substrate at the bottom of the gate line slits can be doped (e.g., by ion implantation or thermal diffusion) to form a doped region as an array common source region.

Further, in some embodiments, one or more polysilicon layers are deposited in the gate line slits. In some embodiments, the one or more polysilicon layers can be suitably doped. Further, the polysilicon layers outside of the gate line slits can be removed, and an etch back process is performed to remove an upper portion of the polysilicon layers in the gate line slits to form a recess in each gate line slits. Then, tungsten can be deposited on the wafer to fill the recesses at the upper portion of the gate line slits. The excessive tungsten layer outside of the gate line slits can be removed by chemical mechanical polishing (CMP) process.

At S655, some intermediate process(es) before the thermal process for warpage control are performed. In some examples, the intermediate processes are not sensitive to wafer warpage. In some examples, the intermediate processes can be suitable processes before the back end of line (BEOL) processes. Generally, the BEOL processes use relatively low temperature and have little influence on wafer warpage. In an example, the stage to perform the thermal process can be determined based on process sensitivity to wafer warpage. In another example, the thermal process for warpage control is before the BEOL processes.

At S660, current wafer warpage is measured. In some examples, the wafer bow can be measured.

At S670, a thermal profile is determined based on the measurement of the wafer warpage and the thermal-warpage adjustment relationship. In an example, when the wafer warpage is within an acceptable range, no thermal process is needed. When the wafer warpage is out of the acceptable range, the thermal profile is determined to cause the polysilicon to apply stress to counteract the wafer warpage, thus the determined thermal profile can pull the wafer warpage back in the acceptable range. In an example, the thermal profile is selected from a plurality of thermal profiles that are pre-characterized for warpage adjustment. In another example, certain parameters for the thermal profile, such as a temperature for ramping up/down, a ramp up/down speed of the temperature, a holding time of the temperature, and a number of cycles for ramping up/down of the temperature, and the like, can be determined.

In some embodiments, the thermal profiles and the corresponding warpage adjustments that are pre-characterized are stored in a memory in the form of a look-up table. Then, when a preferred warpage adjustment (e.g., to pull the wafer warpage in the acceptable range) is determined, the corresponding thermal profile can be determined based on the look-up table.

In some other embodiments, based on characterizations, a relationship of one or more parameters of a thermal profile to the warpage adjustment can be determined in the form of an equation, such as a linear equation, a non-linear equation and the like. Then, when a preferred warpage adjustment (e.g., to pull the wafer warpage in the acceptable range) is determined, the one or more parameters of the thermal profile can be determined based on the equation.

At S680, a process is performed on the wafer based on the determined thermal profile.

At S690, further process(es) can be performed on the semiconductor device. For example, the BEOL processes can be performed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for wafer warpage control, comprising:
   forming a filling structure in a slit opening on a wafer;
   measuring a warpage parameter of the wafer;
   determining a thermal profile to adjust a warpage parameter into a target range based on the warpage parameter; and
   performing a process having the determined thermal profile to adjust the warpage parameter into the target range.

2. The method of claim 1, wherein forming the filling structure in the slit opening on the wafer comprises:
   forming the filling structure in the slit opening on the wafer with polysilicon that is characterized of a thermal-warpage adjustment relationship;
   determining the thermal profile to adjust the warpage parameter into the target range based on the thermal-warpage adjustment relationship.

3. The method of claim 2, wherein determining the thermal profile to adjust the warpage parameter into the target range based on the thermal-warpage adjustment relationship further comprises:
   determining the thermal profile based on a lookup table storing a plurality of thermal profiles with corresponding warpage adjustments.

4. The method of claim 2, wherein determining the thermal profile to adjust the warpage parameter into the target range based on the thermal-warpage adjustment relationship further comprises:
   determining the thermal profile based on an equation of a thermal parameter and the warpage adjustment.

5. The method of claim 1, wherein the filling structure at least partly comprises a polysilicon material.

6. The method of claim 5, further comprising:
   using the thermal profile to fill the voids in the polysilicon material.

7. The method of claim 5, wherein the filling structure comprises a first portion of a polysilicon material and a second portion of a metal material.

8. The method of claim 5, wherein the filling structures comprises a first portion of a doped polysilicon and a second portion of a metal material.

9. The method of claim 5, further comprising:
   depositing a polysilicon layer that forms a first filling structure in the slit opening;
   removing an upper portion of the first filling structure to form a recess in the slit opening; and
   depositing a metal layer into the recess in the slit opening.

10. The method of claim 5, further comprising:
    depositing a polysilicon layer that forms a polysilicon filling portion in the slit opening, the polysilicon filing portion having at least a void in the polysilicon; and
    performing the process having the determined thermal profile to fill the void.

11. The method of claim 10, wherein performing the process having the determined thermal profile to fill the void further comprises
    raising a temperature for the process in a time period shorter than a rising time limit when the warpage parameter is in the target range.

12. The method of claim 10, wherein performing the process having the determined thermal profile to fill the void further comprises:
    raising the temperature in a first step of the process to a first temperature for a time duration
    raising the temperature in a second step of the process to a second temperature.

13. The method of claim 12, further comprising:
    breaking the void into smaller voids by the first step; and
    filling the smaller voids by the second step.

14. The method of claim 1, further comprising:
    stacking sacrificial gate layers and insulating layers alternatingly along a direction perpendicular to a substrate of the semiconductor device to form a stack of alternating sacrificial gate layers and insulating layer upon the substrate;
    forming channel structures in the stack of alternating sacrificial gate layers and insulating layers; and
    forming the slit opening in the stack of alternating sacrificial gate layers and insulating layers.

15. The method of claim 14, further comprising:
    replacing, via the slit opening, the sacrificial gate layers with gate layers.

16. The method of claim 15, further comprising:
    forming an isolation layer on the sidewall of the slit opening before forming the filling structure in the slit opening.

17. The method of claim 16, further comprising:
    forming a doped region at a bottom of the slit opening, the doped region being conductively connected to at least a source terminal of a channel structure.

18. The method of claim 1, wherein determining the thermal profile to adjust the warpage parameter into the target range based on the warpage parameter further comprises:
    determining at least one of a temperature for ramping up/down, a ramp up/down speed of the temperature, a holding time of the temperature, and a number of cycles for ramping up/down of the temperature.

19. The method of claim 1, further comprising:
    determining a stage in fabrication processes of the wafer to insert the process having the determined thermal profile.

20. The method of claim 1, further comprising:
    varying an existing process to have the determined thermal profile.

* * * * *